(12) United States Patent
Wu

(10) Patent No.: US 7,085,165 B2
(45) Date of Patent: Aug. 1, 2006

(54) METHOD AND APPARATUS FOR REDUCING READ DISTURB IN NON-VOLATILE MEMORY

(75) Inventor: Chao-I Wu, Tainan (TW)

(73) Assignee: Macronix International Co., Ltd., Hsinchu (TW)

( * ) Notice: Subject to any disclaimer, the term of this patent is extended or adjusted under 35 U.S.C. 154(b) by 37 days.

(21) Appl. No.: 11/027,720

(22) Filed: Dec. 30, 2004

(65) Prior Publication Data

US 2006/0146615 A1 Jul. 6, 2006

(51) Int. Cl.
*G11C 11/34* (2006.01)
(52) U.S. Cl. .............................. 365/185.18; 365/185.24
(58) Field of Classification Search ........... 365/185.18, 365/185.24
See application file for complete search history.

(56) References Cited

U.S. PATENT DOCUMENTS

| | | | |
|---|---|---|---|
| 6,011,725 A | 1/2000 | Eitan | |
| 6,160,737 A | 12/2000 | Hsu et al. | |
| 6,466,477 B1 | 10/2002 | Huang et al. | |
| 6,487,114 B1 | 11/2002 | Jong et al. | |
| 6,618,290 B1 * | 9/2003 | Wang et al. ............ | 365/185.28 |
| 6,768,673 B1 * | 7/2004 | Hsia et al. ............. | 365/185.03 |
| 6,778,442 B1 * | 8/2004 | Hamilton et al. ...... | 365/185.28 |
| 2002/0139999 A1 | 10/2002 | Hirano | |
| 2003/0137873 A1 | 7/2003 | Kawamura | |

OTHER PUBLICATIONS

T.Y. Chan et al. "A True Single-Transistor Oxide-Nitride-Oxide EEPROM Device" IEEE Eloctron Device letters, vol. EDL-8, No. 3 Mar. 1987, pp. 93-95.

* cited by examiner

Primary Examiner—Michael Tran
(74) *Attorney, Agent, or Firm*—Kenta Suzue; Haynes Beffel & Wolfeld LLP

(57) ABSTRACT

A memory cell with a charge-trapping structure stores multiple bits. A biasing arrangement is applied to one part of the charge-trapping structure of the memory cell to store a high threshold state, and a biasing arrangement is applied to another part of the charge-trapping structure tending to raise its threshold voltage without exceeding a maximum threshold voltage of the low threshold state, reducing the read disturb effect between different parts of the memory cell. In another charge-trapping memory cell, when a biasing arrangement is applied to the memory cell to store a higher threshold state, the biasing arrangement tends to cause different parts of the charge-trapping structure of the memory cell to store a higher threshold state, and when a biasing arrangement is applied to the memory cell to store a lower threshold state, the biasing arrangement tends to cause different parts of the charge-trapping structure of the memory cell to store a lower threshold state. In yet another charge-trapping memory cell, a biasing arrangement is applied tending to cause multiple bits of the charge-trapping structure to store a low threshold state, and then a biasing arrangement is applied tending to raise threshold voltages of parts of the charge-trapping structure corresponding to the memory cell without exceeding a maximum threshold voltage of the low threshold state. The read disturb effect between the different parts of the memory cell is thereby reduced.

70 Claims, 13 Drawing Sheets

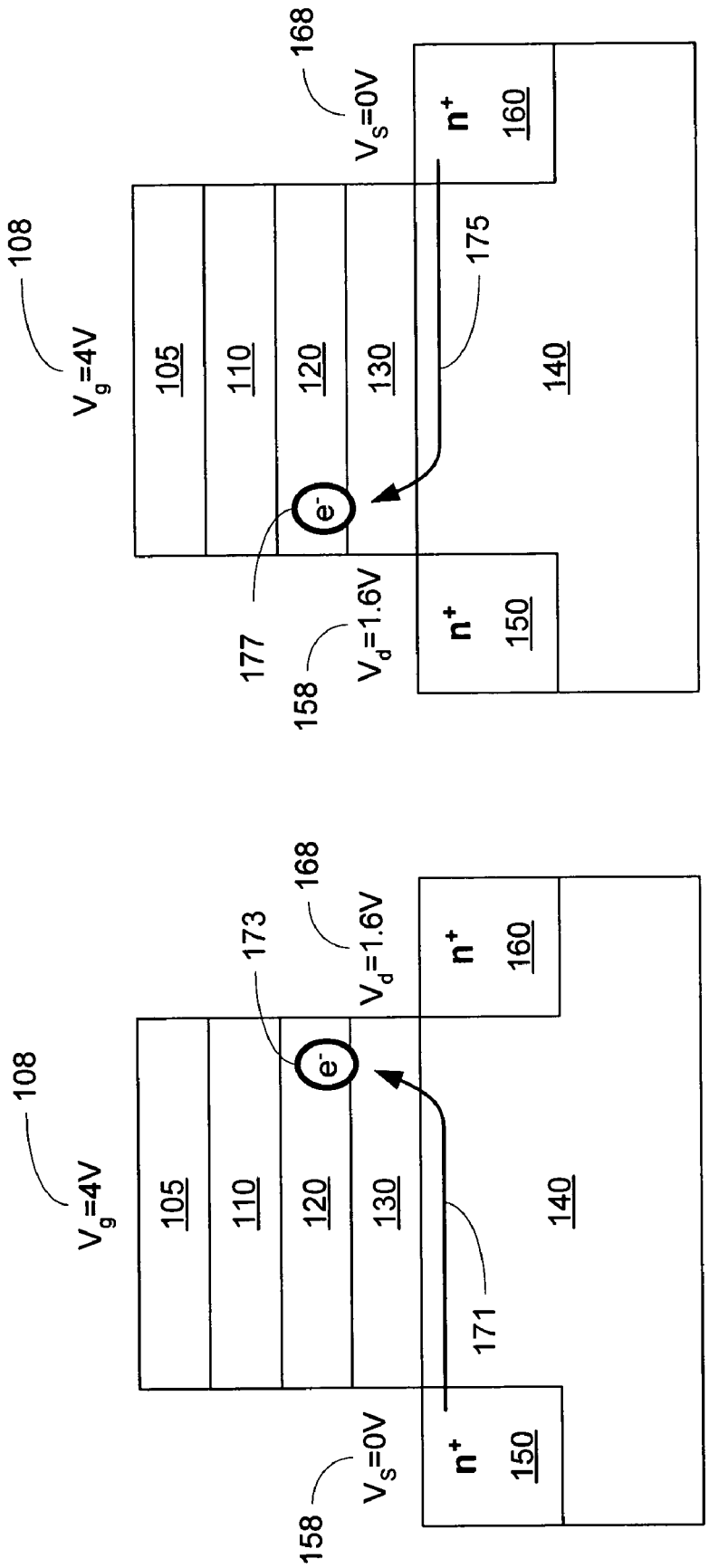

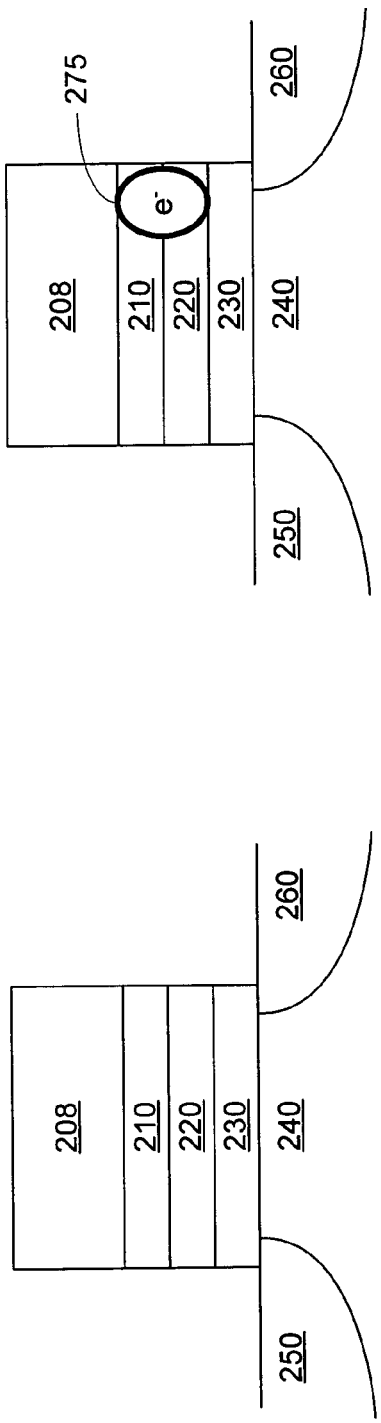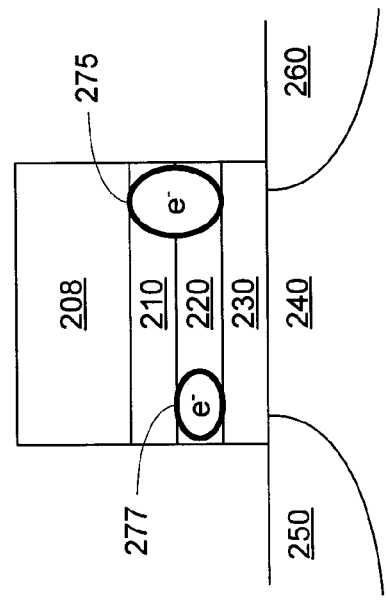

METHOD AND APPARATUS FOR REDUCING READ DISTURB IN NON-VOLATILE MEMORY

BACKGROUND OF THE INVENTION

1. Field of the Invention

The field of the invention is non-volatile memory and integrated circuits with non-volatile memory generally, and more specifically, to operating methods and circuitry for the non-volatile memory.

2. Description of Related Art

Read disturb presents an increasingly serious problem to the operation of non-volatile memory cells in general, and charge-trapping memory cells in particular. Read disturb occurs when read operations are carried out on the memory cell. During a read operation, a drain bias such as 1.6 V can cause current flow from the source to the drain of the memory cell. The drain bias can be sufficiently high to add electrons to the trapping part of the charge-trapping structure by the drain. After repeated read operations, these added electrons raise the threshold voltage of the trapping part of the charge-trapping structure by the drain.

FIGS. 1A and 1B show the read disturb problem in memory cells. Both FIGS. 1A and 1B show a charge-trapping memory cell with a substrate 140, first current-carrying terminal 150, second current-carrying terminal 160, bottom oxide 130, charge-trapping structure 120, top oxide 110, and gate 105. The gate 105 has a 4V bias. Depending on which of the first current-carrying terminal 150 and the second current-carrying terminal 160 has a higher voltage, either can act as the drain.

In FIG. 1A, the first current-carrying terminal 150 has a bias of 0V and the second current-carrying terminal 160 has a bias of 1.6V. In this read bias configuration, electrons 173 move along path 171 from the first current-carrying terminal 150 through the substrate 140 toward the second current-carrying terminal 160, transit the bottom oxide 130, and are trapped in charge-trapping structure 120.

In FIG. 1B, the first current-carrying terminal 150 has a bias of 1.6V and the second current-carrying terminal 160 has a bias of 0V. In this read bias configuration, electrons 177 move along path 175 from the second current-carrying terminal 160 through the substrate 140 toward the first current-carrying terminal 150, transit the bottom oxide 130, and are trapped in charge-trapping structure 120.

A serious consequence of read disturb is that, after multiple read operations, the trapping part of the charge-trapping structure by the drain which originally stored the low threshold state instead stores a high threshold state, due to read disturb. In a less extreme consequence of read disturb, the trapping part of the charge-trapping structure by the drain which originally stored the low threshold state instead stores an indeterminate state—the threshold voltage of the trapping part of the charge-trapping structure by the drain is raised to a voltage above the upper limit of the low threshold state (e.g., above erase verify) but below the lower limit of the high threshold state (e.g., below program verify). Accordingly, what is needed is a solution to the read disturb problem of charge-trapping memory cells.

SUMMARY OF THE INVENTION

One aspect of the invention is directed to a charge-trapping integrated circuit.

In some embodiments, the integrated circuit includes an array of charge-trapping memory cells and logic responsive to a command to store the high threshold state in part of the charge-trapping structure of at least one memory cell. Each charge-trapping memory cell has at least a low threshold state and a high threshold state, a first current-carrying terminal, a second current-carrying terminal, and a charge-trapping structure with at least a first trapping part and a second trapping part. Each of the first trapping part and the second trapping part is associated with a threshold voltage and at least a high threshold state and a low threshold state. The logic responsive to a command to store the high threshold state in the first trapping part applies a biasing arrangement for establishing the high threshold state in the first trapping part by setting the threshold voltage associated with the first trapping part in the high threshold state, and then applies a biasing arrangement for raising the threshold voltage associated with the second trapping part without exceeding a maximum threshold voltage of the low threshold state.

In some embodiments, the integrated circuit includes an array of charge-trapping memory cells and responsive logic. Each charge-trapping memory cell has at least a low threshold state and a high threshold state. Each charge-trapping memory cell includes a first current-carrying terminal, a second current-carrying terminal, and a charge-trapping structure with a first trapping part and a second trapping part. Each of the first trapping part and the second trapping part is associated with a threshold voltage and at least a high threshold state and a low threshold state. The responsive logic is responsive to a command to store the low threshold state in the first trapping part and a second trapping part, by applies a biasing arrangement for establishing the low threshold state in the first trapping part and a second trapping part, including setting the threshold voltages associated with the first trapping part and second trapping part in the low threshold state, and then applies a biasing arrangement for raising the threshold voltage associated with the first trapping part and raising the threshold voltage associated with the second trapping part without exceeding a maximum threshold voltage of the low threshold state.

In some embodiments, the integrated circuit includes an array of charge-trapping memory cells and responsive logic. Each charge-trapping memory cell has at least a low threshold state and a high threshold state. Each charge-trapping memory cell includes a first current-carrying terminal, a second current-carrying terminal, and a charge-trapping structure with a first trapping part and a second trapping part. Each of the first trapping part and the second trapping part is associated with a threshold voltage and at least a high threshold state and a low threshold state. The responsive logic is responsive to multiple commands. First, the responsive logic is responsive to a command to store the high threshold state in the charge-trapping memory cell by applying a biasing arrangement for establishing the low threshold state in the charge-trapping memory cell, including setting the threshold voltages for the first trapping part and the second trapping part in the low threshold state. Second, the responsive logic is responsive to a command to store the high threshold state in the charge-trapping memory cell by applies a biasing arrangement for establishing the high threshold state in the charge-trapping memory cell, including raising the threshold voltage for the first trapping part into the high threshold state and raising the threshold voltage for the second trapping part into the high threshold state.

One aspect of the invention is directed to a method of operating a charge-trapping memory cell on a substrate.

In some embodiments, the charge-trapping memory cell has a first current-carrying terminal, a second current-carrying terminal, and a charge-trapping structure with a first trapping part and a second trapping part. Each of the first trapping part and the second trapping part is associated with a threshold voltage and at least a high threshold state and a low threshold state. The method is responsive to a command to store the high threshold state in the first trapping part. A biasing arrangement is applied for establishing the high threshold state in the first trapping part by setting the threshold voltage associated with the first trapping part in the high threshold state. Then, biasing arrangement is applied for raising the threshold voltage associated with the second trapping part without exceeding a maximum threshold voltage of the low threshold state.

In one embodiment, where each of the first trapping part and the second trapping part has only the high threshold state and the low threshold state, the low threshold state is the logical state having the lowest range of threshold voltages and the high threshold state is the logical state having the highest range of threshold voltages.

In another embodiment, one or more logical states exist above the high threshold state. In this embodiment, one or more logical states have a range of threshold voltages higher than the range of threshold voltages associated with the high threshold state.

In some embodiments, the charge-trapping memory cell has a first current-carrying terminal, a second current-carrying terminal, and a charge-trapping structure with a first trapping part and a second trapping part. Each of the first trapping part and the second trapping part is associated with a threshold voltage and at least a high threshold state and a low threshold state. The method is responsive to a command to store the low threshold state in the first trapping part and the second trapping part. A biasing arrangement is applied for establishing the low threshold state in the first trapping part and the second trapping part by setting the threshold voltages associated with the first trapping part and the second trapping part in the low threshold state. Then, a biasing arrangement is applied for raising the threshold voltage associated with the first trapping part without exceeding a maximum threshold voltage of the low threshold state, and the threshold voltage associated with the second trapping part is raised without exceeding the maximum threshold voltage of the low threshold state.

In some embodiments, the charge-trapping memory cell has a first current-carrying terminal, a second current-carrying terminal, at least a low threshold state and a high threshold state, and a charge-trapping structure with a first trapping part and a second trapping part. Each of the first trapping part and the second trapping part is associated with a threshold voltage and at least a high threshold state and a low threshold state. Part of the method is responsive to a command to store the low threshold state in the charge-trapping memory cell. A biasing arrangement is applied for establishing the low threshold state in the charge-trapping memory cell by setting the threshold voltages for the first trapping part and the second trapping part in the low threshold state. Part of the method is responsive to a command to store the high threshold state in the charge-trapping memory cell. A biasing arrangement is applied for establishing the high threshold state in the charge-trapping memory cell by setting the threshold voltage for the first trapping part in the high threshold state and setting the threshold voltage for the second trapping part in the high threshold state.

BRIEF DESCRIPTION OF THE DRAWINGS

FIGS. 1A and 1B show the read disturb problem in memory cells.

FIGS. 2A, 2B and 2C show a charge-trapping memory cell undergoing the establishing of a high threshold state in part of the charge-trapping structure, followed by the raising of the threshold voltage associated with another part of the charge-trapping structure.

DETAILED DESCRIPTION

Figure 3B:
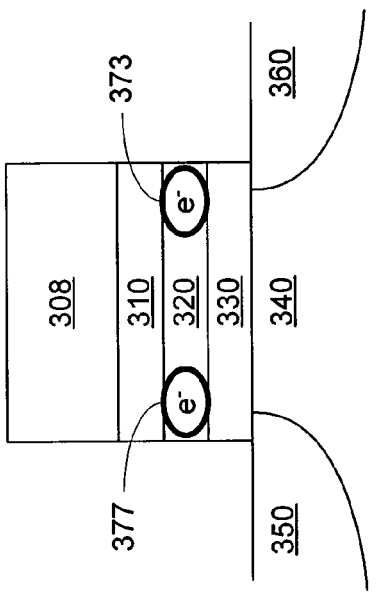
FIGS. 3A, 3B, 3C and 3D show a charge-trapping memory cell undergoing the establishing of threshold states by establishing threshold states in different parts of the charge-trapping structure.

Threshold voltage generally refers to the voltage applied to the gate which results in current flow between the source and drain. As used herein, different threshold voltages are also associated with different parts of the charge-trapping structure. In the disclosed embodiments, a current-carrying terminal voltage of 1.6V is used to measure the threshold voltages associated with different parts of the charge-trapping structure, using the reverse read method. During programming, charge is injected into the charge-trapping structure. Since the charge-trapping structure is a nonconductor, the trapped charge remains localized to the part of the charge-trapping structure near the point of injection. Because different parts of the charge-trapping structure trap different amounts of charge, a gate voltage that is sufficiently high to form a channel under one part of the charge-trapping structure may be too low to form a channel under another part of the charge-trapping structure. Thus, the localization of trapped charge to different parts of the charge-trapping structure leads to different threshold voltages associated with different parts of the charge-trapping structure.

FIGS. 2A, 2B and 2C show a charge-trapping memory cell undergoing the establishing of a high threshold state in part of the charge-trapping structure, followed by the raising of the threshold voltage associated with another part of the charge-trapping structure. FIGS. 2A, 2B and 2C show a charge-trapping memory cell with a substrate 240, first current-carrying terminal 250, second current-carrying terminal 260, bottom oxide 230, charge-trapping structure 220, top oxide 210, and gate 208. Representative top oxides include silicon dioxide and silicon oxynitride having a thickness of about 50 to 100 Angstroms, or other similar high dielectric constant materials including for example $Al_2O_3$. Representative bottom oxides include silicon dioxide and silicon oxynitride having a thickness of about 30 to 100 Angstroms, or other similar high dielectric constant materials. Representative charge-trapping structures include silicon nitride having a thickness of about 30 to 90 Angstroms, or other similar high dielectric constant materials, including metal oxides such as $Al_2O_3$, $HfO_2$, and others. The charge-trapping structure may be a discontinuous set of pockets or particles of charge-trapping material, or a continuous layer as shown in the drawing.

In FIG. 2A, both the right and left parts of the charge-trapping structure 220 are in a low threshold state, as shown by the absence of trapped charge in both sides of the charge-trapping structure 220. The threshold voltage of the right and left sides of the charge-trapping structure in this embodiment is about 2V.

In FIG. 2B, the right part of the charge-trapping structure 220 undergoes an operation to establish a high threshold state. Consequently, the right part of the charge-trapping structure 220 has trapped charge 275. In all the figures herein, the drawn size of the trapped charge indicates the magnitude of trapped charge in the charge-trapping structure, and is not meant to indicate that the position of the trapped charge is largely shared between the charge-trapping structure 220 and other parts of the memory cell such as the top oxide 210. The highly asymmetrically trapped charge leads to a read disturb problem, particularly if a drain bias is placed on the first current-carrying terminal 250.

In FIG. 2C, the left part of the charge-trapping structure 220 undergoes an operation to raise the threshold voltage associated with the left part. Consequently, the left part of the charge-trapping structure 220 has trapped charge 277. The amounts of trapped charge 275 and 277 in the right and left parts of the charge-trapping structure 220 are asymmetrical, because the magnitude of the trapped charge 277 is sufficiently low such that the left part of the charge-trapping structure 220 remains in a low threshold state, whereas the magnitude of the trapped charge 275 is sufficiently high such that the right part of the charge-trapping structure 220 is in a high threshold state. Nevertheless, the magnitude of the trapped charge 277 is sufficient to reduce lateral electrical fields in the substrate 240 and to reduce the read disturb effect.

FIGS. 3A, 3B, 3C and 3D show a charge-trapping memory cell undergoing establishing of threshold states in the charge-trapping memory cell by establishing threshold states in different parts of the charge-trapping structure. FIGS. 3A, 3B, 3C and 3D show a charge-trapping memory cell with a substrate 340, first current-carrying terminal 350, second current-carrying terminal 360, bottom oxide 330, charge-trapping structure 320, top oxide 310, and gate 308.

Figure 3D:
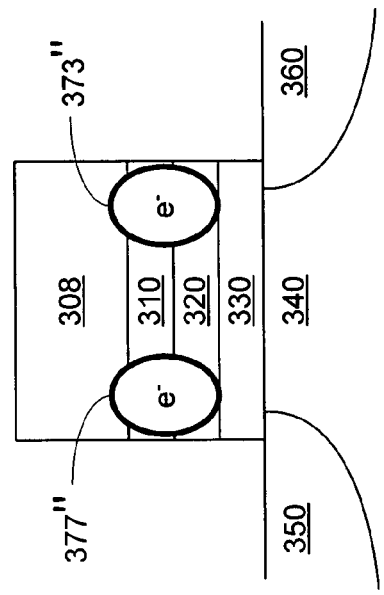
Figure 3A:
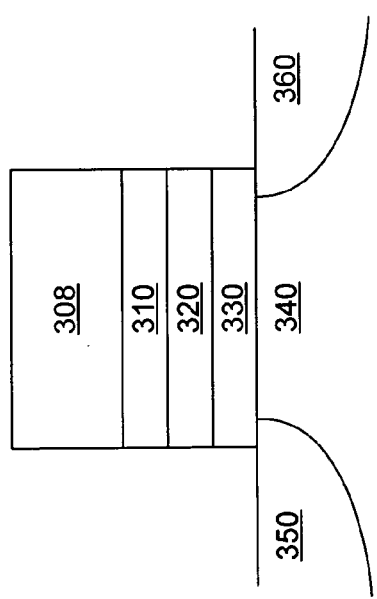

In FIG. 3A, the charge-trapping memory cell is in a low threshold state, because both the right and left parts of the charge-trapping structure 320 are in a low threshold state, as shown by the absence of trapped charge in both sides of the charge-trapping structure 320. The threshold voltage of the right and left sides of charge-trapping structure is about 2V.

In FIG. 3B, the charge-trapping memory cell is in a high threshold state, after both the right and left parts of the charge-trapping structure 320 undergo an operation to establish a high threshold state. Consequently, the right part of the charge-trapping structure 320 has trapped charge 373 and the left part of the charge-trapping structure 320 has trapped charge 377. The symmetrical nature of the magnitudes of the trapped charge 373 and 377 reduces lateral electrical fields in the substrate 240 and the read disturb effect. The threshold voltage of the right and left sides of charge-trapping structure is about 3V. In another embodiment, the magnitudes of the trapped charge are slightly unequal, but the magnitudes of the trapped charge are close enough to each other such that the right and left parts of the charge-trapping structure 320 are both in the high threshold state.

Figure 3C:
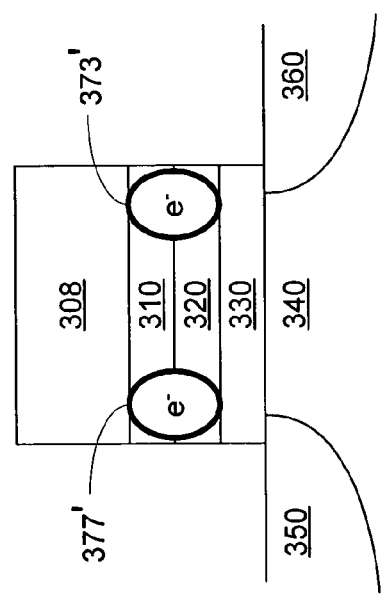

FIGS. 3C and 3D show higher threshold states established in the charge-trapping memory cell. In FIG. 3C, the charge-trapping memory cell is in a higher threshold state because the right part of the charge-trapping structure 320 has trapped charge 373' and the left part of the charge-trapping structure 320 has trapped charge 377'. The threshold voltage of the right and left sides of charge-trapping structure is about 4V. In FIG. 3D, the charge-trapping memory cell is in a yet higher threshold state because the right part of the charge-trapping structure 320 has trapped charge 373" and the left part of the charge-trapping structure 320 has trapped charge 377". The threshold voltage of the right and left sides of charge-trapping structure is about 5V.

Figure 4:
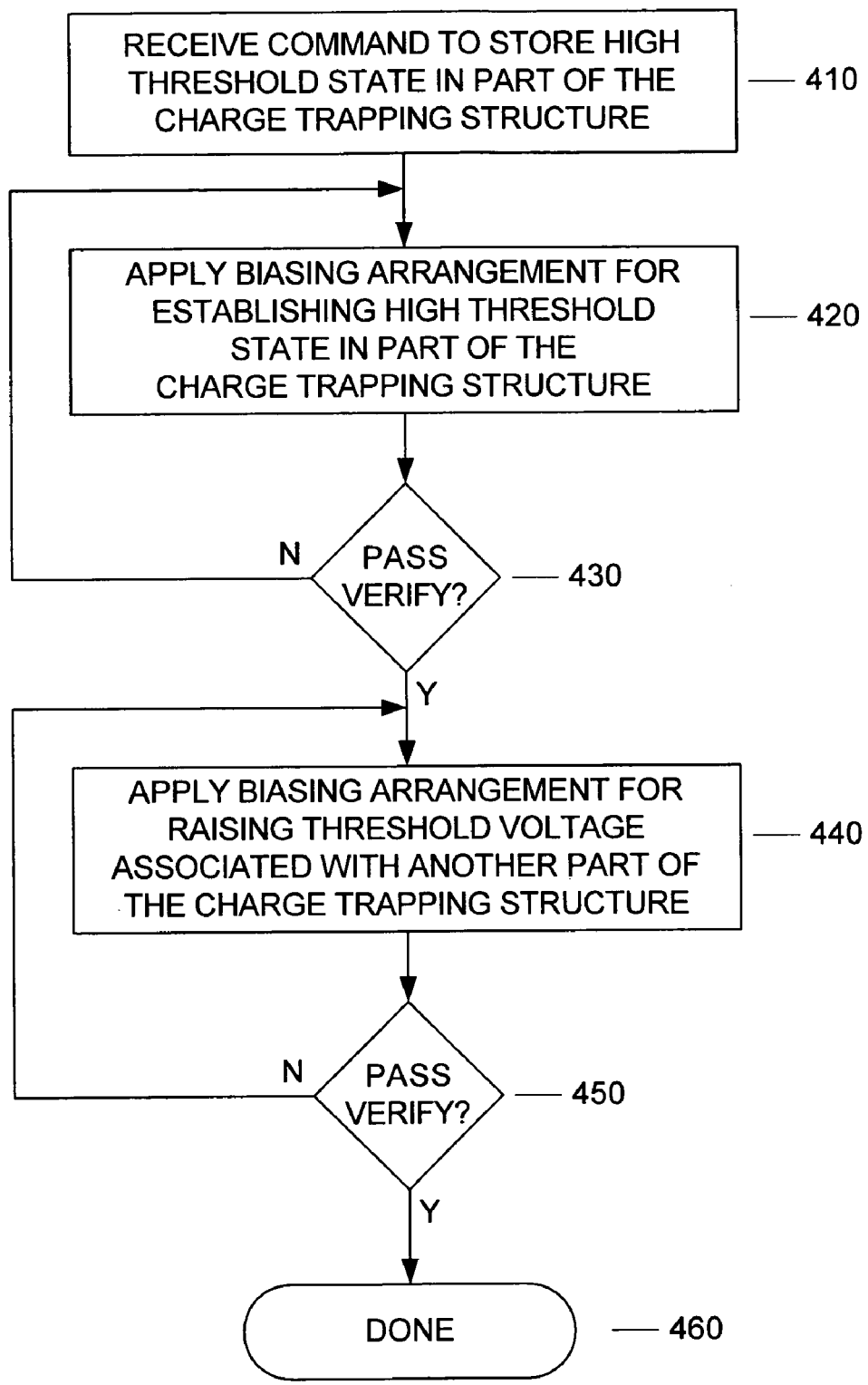
FIG. 4 shows an exemplary process flow for establishing a high threshold state in part of the charge-trapping structure, followed by raising the threshold voltage associated with another part of the charge-trapping structure.

FIG. 4 shows an exemplary process flow for establishing a high threshold state in part of the charge-trapping structure, followed by raising the threshold voltage associated with another part of the charge-trapping structure. In 410, a command is received to store the high threshold state in part of the charge-trapping structure. In 420, responsive to the command received in 410, a biasing arrangement is applied tending to establish the high threshold state in part of the charge-trapping structure. Subsequent commands may occur between an original command to store a certain threshold state and the actual occurrence of applying the biasing arrangement for the threshold voltage change to store the certain threshold state, so long as the actual occurrence of applying the biasing arrangement for the threshold voltage change is responsive to the original command. The threshold voltage for the part of the charge-trapping structure is set in the high threshold state. In 430, it is checked whether the operation of 420 passes verify. For example, the threshold voltage of the part of the charge-trapping structure should be above the minimum of the threshold voltage range defining the high threshold state. If the verify is not passed, then 420 is repeated. In 440, the biasing arrangement is applied for raising the threshold voltage associated with another part of the charge-trapping structure. The threshold voltage is raised sufficiently to reduce the read disturb problem, but is not raised so much as to exceed the maximum of the threshold voltage range defining the low threshold state. In 450, it is checked whether the operation of 440 passes verify. For example, the threshold voltage of the other part of the charge-trapping structure should be below the maximum of the threshold voltage range defining the low threshold state, but high enough to reduce the read disturb problem. If the verify is not passed, then 440 is repeated. In 460, the operation to establish a high threshold state in part of the charge-trapping structure is done.

Figure 5:
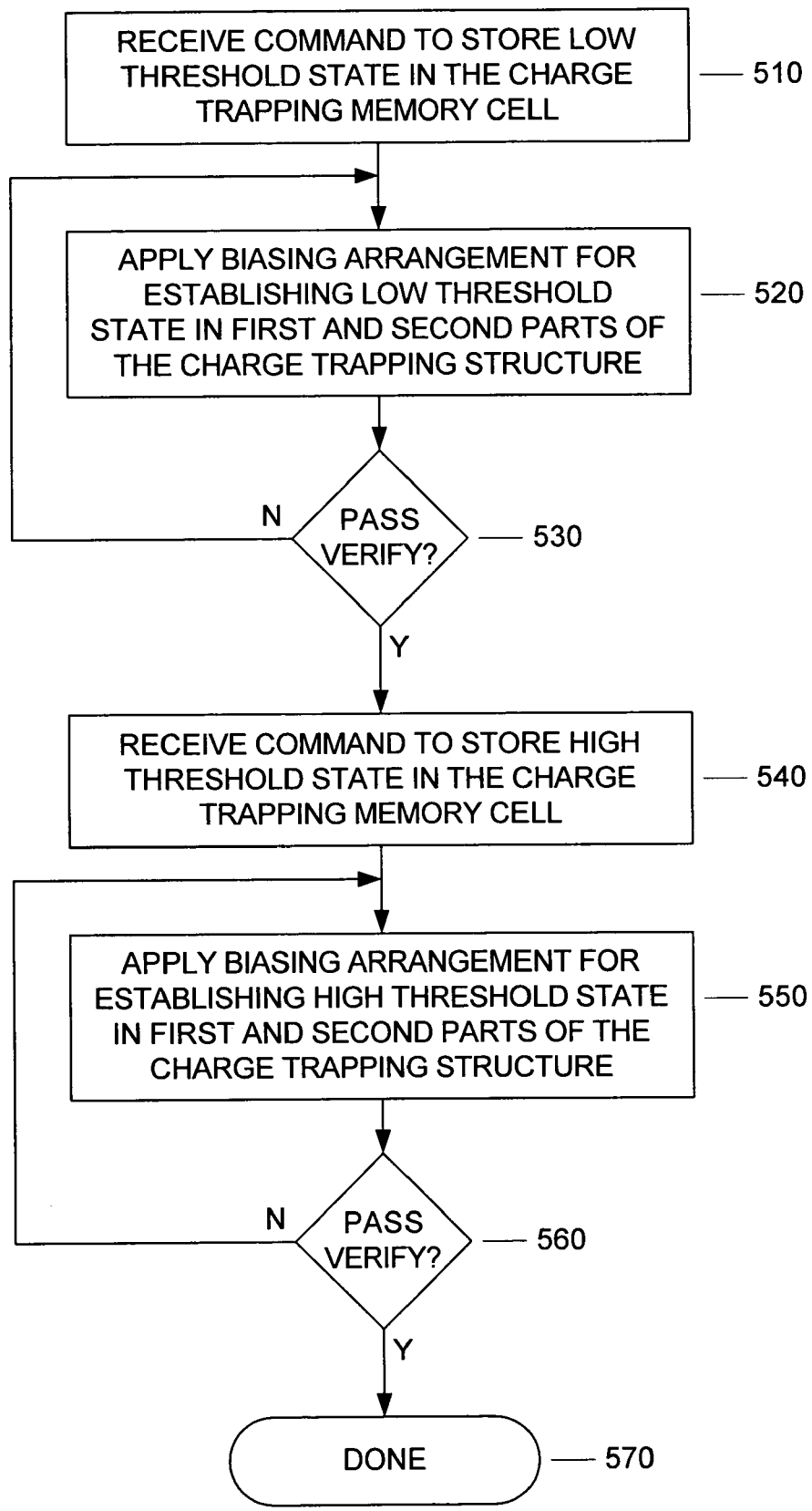
FIG. 5 shows an exemplary process flow for establishing a high threshold state in a charge-trapping memory cell by establishing a high threshold state in different parts of the charge-trapping structure.

FIG. 5 shows an exemplary process flow for establishing a high threshold state in a charge-trapping memory cell by establishing a high threshold state in different parts of the charge-trapping structure. In 510, a command is received to store the low threshold state in the charge-trapping memory cell. In 520, a biasing arrangement is applied tending to establish the low threshold state in different parts of the charge-trapping structure. The threshold voltages for the different parts of the charge-trapping structure are set in the low threshold state. In 530, it is checked whether the operation of 520 passes verify. For example, the threshold voltages of the different parts of the charge-trapping structure should be below the maximum of the threshold voltage range defining the low threshold state. If the verify is not passed, then 520 is repeated. In 540, a command is received to store the high threshold state in the charge-trapping memory cell. In 550, a biasing arrangement is applied tending to establish the high threshold state in the different parts of the charge-trapping structure. The threshold voltages for the different parts are set in the high threshold state. In 560, it is checked whether the operation of 550 passes verify. For example, the threshold voltages of the different parts of the charge-trapping structure should be above the minimum of the threshold voltage range defining the high threshold state. If the verify is not passed, then 550 is repeated. In 570, the process flow is done. In one embodiment, the low threshold state and high threshold state are the only states available. In other embodiments, the low threshold state and high threshold state are only two states out of at least four available states, allowing multi-level cell operation.

Figure 13A:
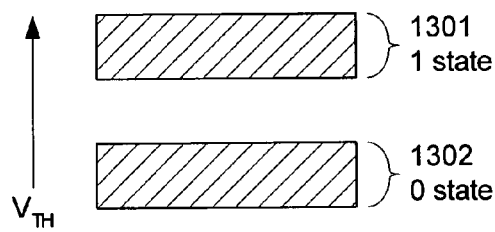
FIG. 13A is a schematic of two-level state operation.
Figure 13B:
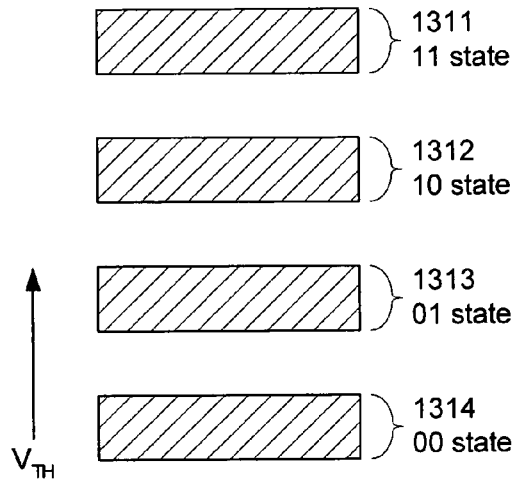
FIGS. 13B, 13C, and 13D are schematics of multi-level threshold states for multi-level cell operation.
Figure 13C:
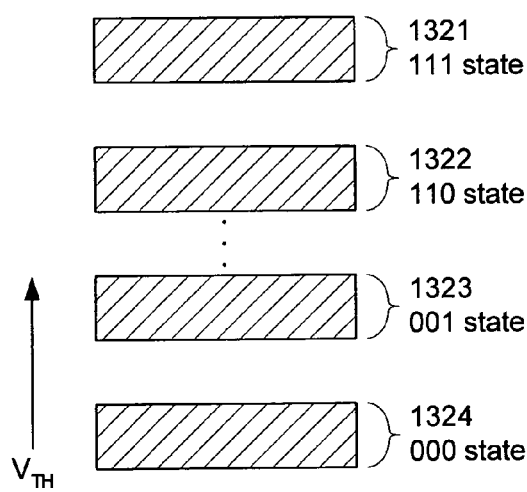
Figure 13D:
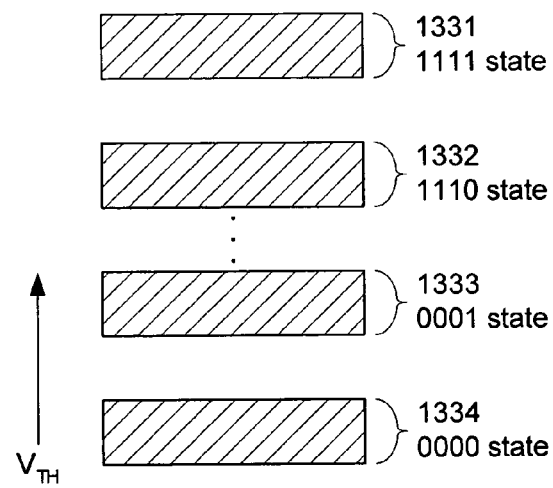

FIGS. 13A, 13B, 13C, and 13D are threshold state schematics corresponding to 1 bit, 2 bits, 3 bits, and 4 bits, respectively. FIG. 13A shows a schematic for two-level threshold state operation. There are two states, the 1 state 1301 and the 0 state 1302. FIG. 13B shows a schematic for four-level threshold state operation. There are 4 states, the 11 state 1311, the 10 state 1312, the 01 state 1313, and the 00 state 1314. FIG. 13C shows a schematic for 8-level threshold state operation. There are 8 states, of which 4 states are shown, the 111 state 1312, the 110 state 1322, the 001 state 1323, and the 000 state 1324. FIG. 13D shows a schematic for 16-level threshold state operation. There are 16 states, of which 4 states are shown, the 1111 state 1331, the 1110 state 1332, the 0001 state 1333, and the 0000 state 1334.

Figure 12:
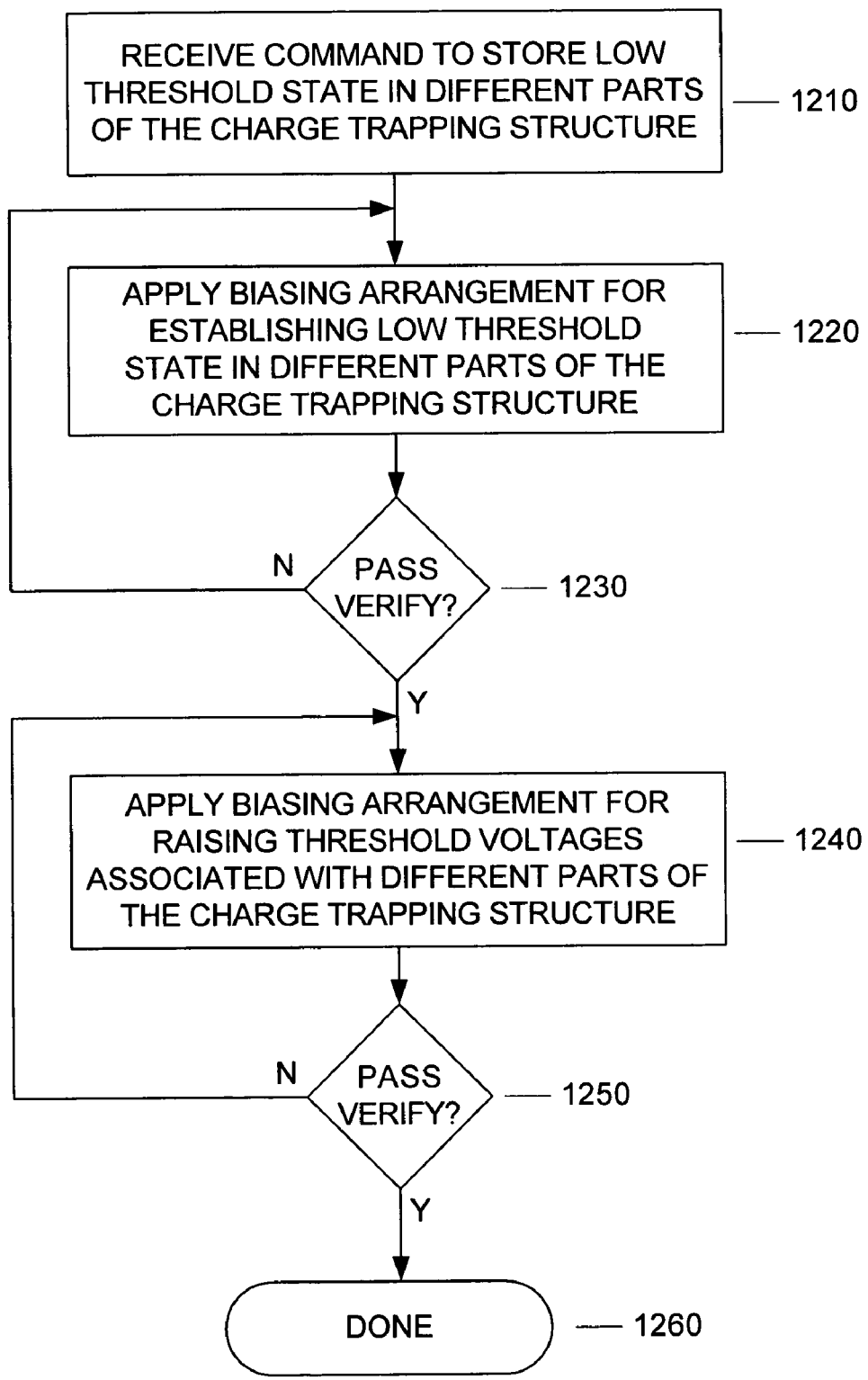
FIG. 12 shows an exemplary process flow for establishing a low threshold state in a charge-trapping memory cell.

FIG. 12 shows an exemplary process flow for establishing a low threshold state in different parts of the charge-trapping structure. In 1210, a command is received to store the low threshold state in different parts of the charge-trapping structure. In 1220, responsive to the command received in 1210, a biasing arrangement is applied tending to establish the low threshold state in different parts of the charge-trapping structure. The threshold voltages for different parts of the charge-trapping structure are set in the low threshold state. In 1230, it is checked whether the operation of 1220 passes verify. For example, the threshold voltage of the part of the charge-trapping structure should be below the maximum of the threshold voltage range defining the low threshold state. If the verify is not passed, then 1220 is repeated. In 1240, a biasing arrangement is applied tending to raise the threshold voltages associated with different parts of the charge-trapping structure. For example, electrons are added to different parts of the charge-trapping structure. This is significantly different from adding electrons to the floating gate of a floating gate memory cell because a floating gate is conductive and does not permit charge to be added to a specific part of the floating gate—charge added from any direction will spread throughout the conductive floating gate. The threshold voltages are raised sufficiently to reduce the read disturb problem, but not raised so much as to exceed a maximum of the threshold voltage range defining the low threshold state. After a sector of memory cells undergoes the operation to establish a low threshold voltage in different parts of the charge-trapping structure in 1220, in 1240 the threshold voltage of different parts of the charge-trapping structure are raised for all memory cells of the sector of memory cells. In 1250, it is checked whether the operation of 1240 passes verify. For example, the threshold voltages of the different parts of the charge-trapping structure should be below the maximum of the threshold voltage range defining the low threshold state, but high enough to reduce the read disturb problem. If the verify is not passed, then 1240 is repeated. In 1260, the operation to establish a low threshold state in different parts of the charge-trapping structure is done.

Figure 6A:
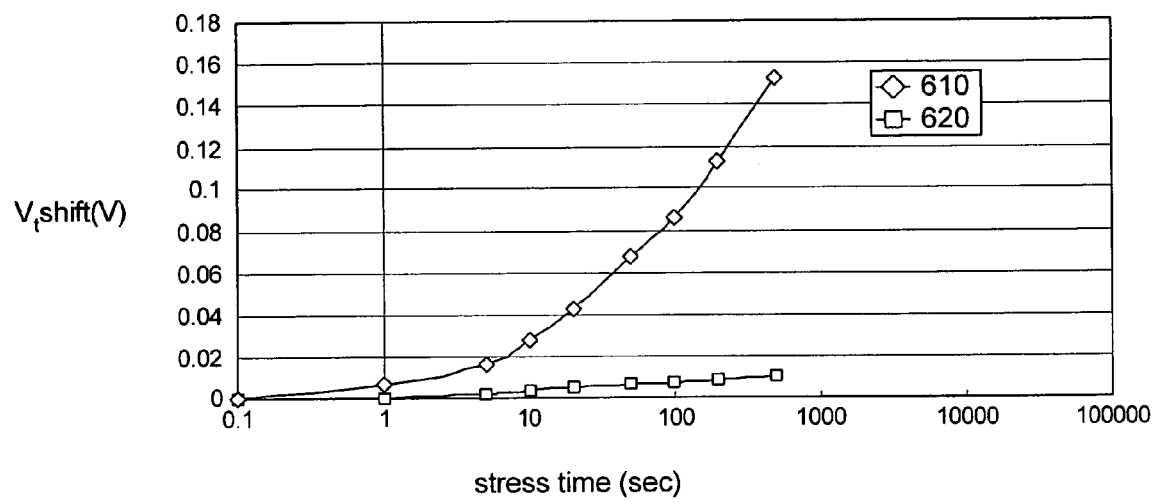
FIGS. 6A and 6B show experimental data for memory cells which indicate a greatly reduced read disturb, resulting from symmetrically raised threshold voltages.
Figure 6B:
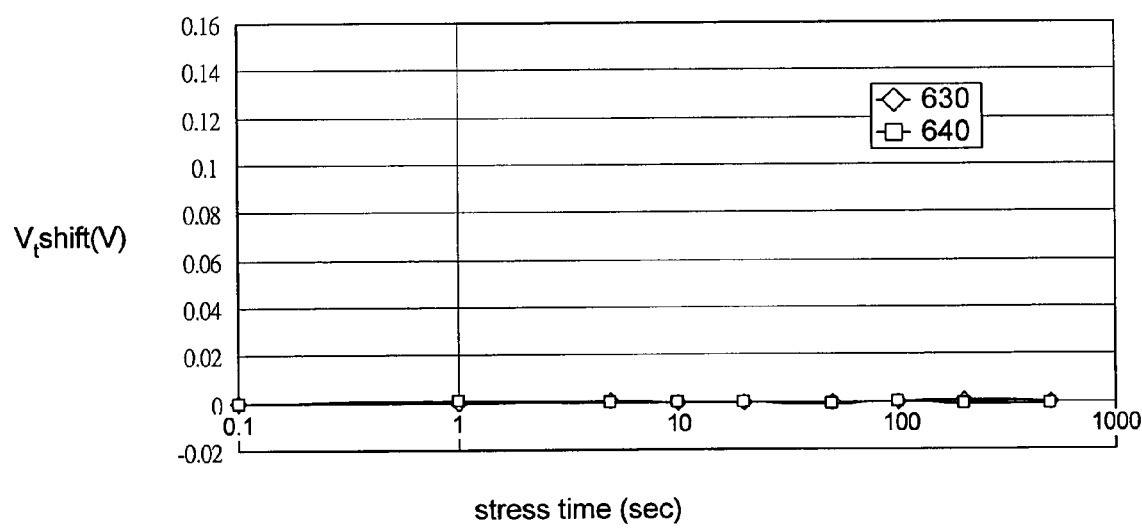

FIGS. 6A and 6B show stress testing experimental data for memory cells which indicate a greatly reduced read disturb, resulting from symmetrically raised threshold voltages. A current-carrying terminal voltage of 1.6V is used to measure the threshold voltages, using the reverse read method. FIG. 6A has trace 610 showing the threshold voltage shift associated with the right side of the charge-trapping structure, and trace 620 showing the threshold voltage shift associated with the left side of the charge-trapping structure. Both the right and left sides of the charge-trapping structure of the memory cell in FIG. 6A are in the low threshold state. During the stress testing conditions in FIG. 6A, the gate voltage is 4V, drain (right side current-carrying terminal) voltage is 2.4V, and the source (left side current-carrying terminal) voltage is 0V. Due to the read disturb effect, electrons moving from the source to the drain and then into the right side of the charge-trapping structure cause the dramatic rise in trace 610 showing the threshold voltage shift associated with the right side of the charge-trapping structure.

FIG. 6B has trace 630 showing the threshold voltage shift associated with the right side of the charge-trapping structure, and trace 640 showing the threshold voltage shift associated with the left side of the charge-trapping structure. Although both the right and left sides of the memory cell in FIG. 6B are in the low threshold state, the threshold voltages for the right and left sides of the charge-trapping structure of the memory cell are higher than for FIG. 6A—about +1V for the left side, and about +0.93V for the right side. During the stress testing conditions in FIG. 6B, the gate voltage is 7V, drain (right side current-carrying terminal) voltage is 2.4V, and the source (left side current-carrying terminal) voltage is 0V. Due to the raised threshold voltages that reduce the read disturb effect, trace 630 showing the threshold voltage shift associated with the right side of the charge-trapping structure is relatively flat.

Figure 7A:
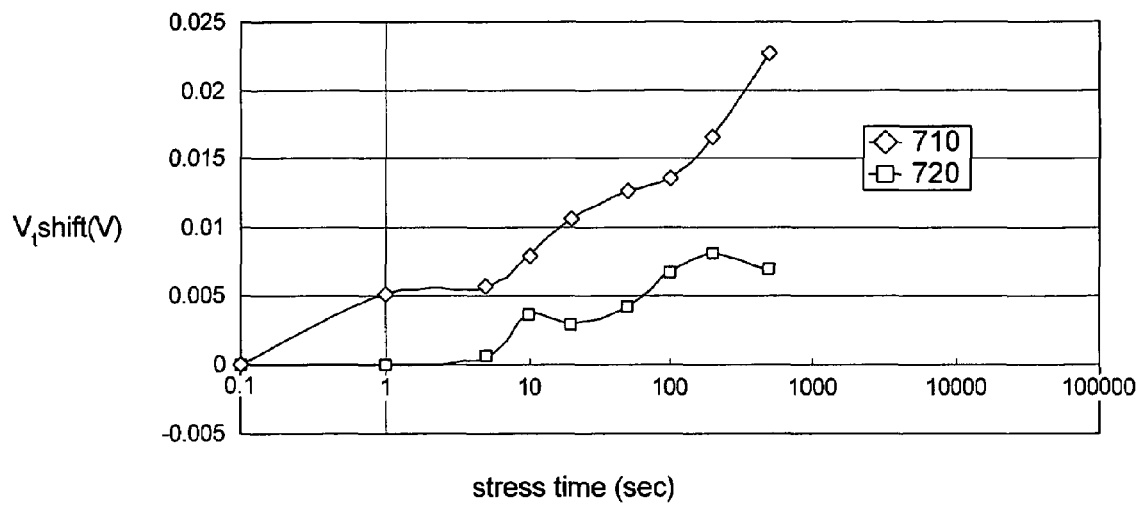
FIGS. 7A and 7B show experimental data for memory cells which indicate a greatly reduced read disturb, when a drain voltage for reading the cell is by a part of the charge-trapping structure in a high threshold state.
Figure 7B:
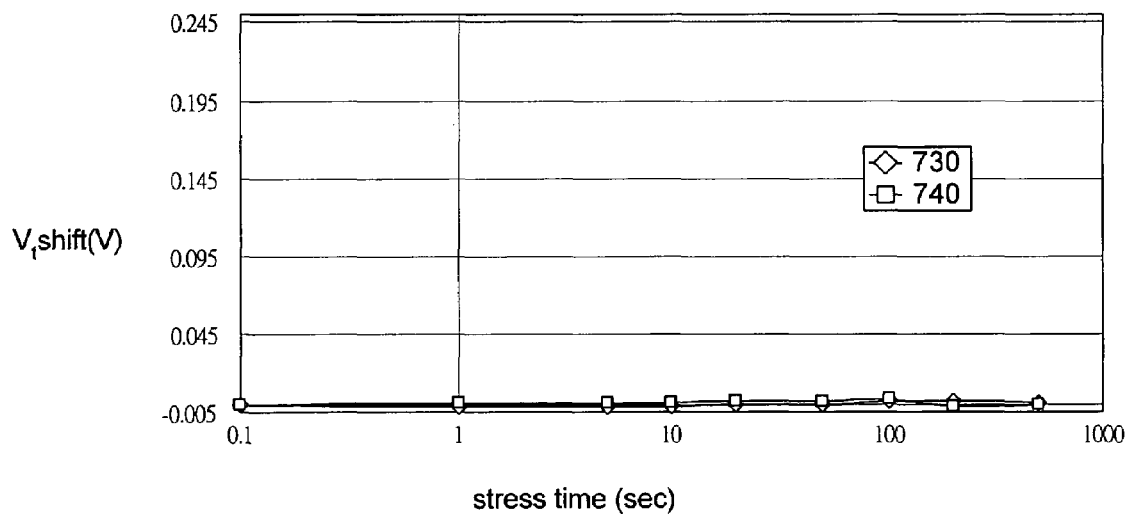

FIGS. 7A and 7B show stress testing experimental data for memory cells which indicate a greatly reduced read disturb, when a drain voltage for reading the cell is by a part of the charge-trapping structure in a high threshold state.

A current-carrying terminal voltage of 1.6V is used to measure the threshold voltages, using the reverse read method. FIG. 7A has trace 710 showing the threshold voltage shift associated with the right side of the charge-trapping structure, and trace 720 showing the threshold voltage shift associated with the left side of the charge-trapping structure. The threshold voltage associated with the right side of the charge-trapping structure has been raised about 5.03V and is in the high threshold state, and the left side of the charge-trapping structure of the memory cell in FIG. 7A is in the low threshold state. During the stress testing conditions in FIG. 7A, the gate voltage is 4.6V, drain (right side current-carrying terminal) voltage is 1.6V, and the source (left side current-carrying terminal) voltage is 0V. Due to the read disturb effect, electrons moving from the source to the drain and then into the right side of the charge-trapping structure cause the rise in trace 710 showing the threshold voltage shift associated with the right side of the charge-trapping structure.

FIG. 7B has trace 730 showing the threshold voltage shift associated with the right side of the charge-trapping structure, and trace 740 showing the threshold voltage shift associated with the left side of the charge-trapping structure. The right side of the charge-trapping structure is in the high threshold state (associated threshold voltage raised about 5.04V). The left side of the charge-trapping structure of the memory cell in FIG. 7B is in the low threshold state, but the threshold voltage associated with the left side of the charge-trapping structure of the memory cell is higher than for FIG. 7A, having been raised about 230 mV. During the stress testing conditions in FIG. 7B, the gate voltage is 4.6V, drain (right side current-carrying terminal) voltage is 1.6V, and the source (left side current-carrying terminal) voltage is 0V. Due to the raised threshold voltages that reduce the read disturb effect, trace 730 showing the threshold voltage shift associated with the right side of the charge-trapping structure is relatively flat.

Figure 8A:
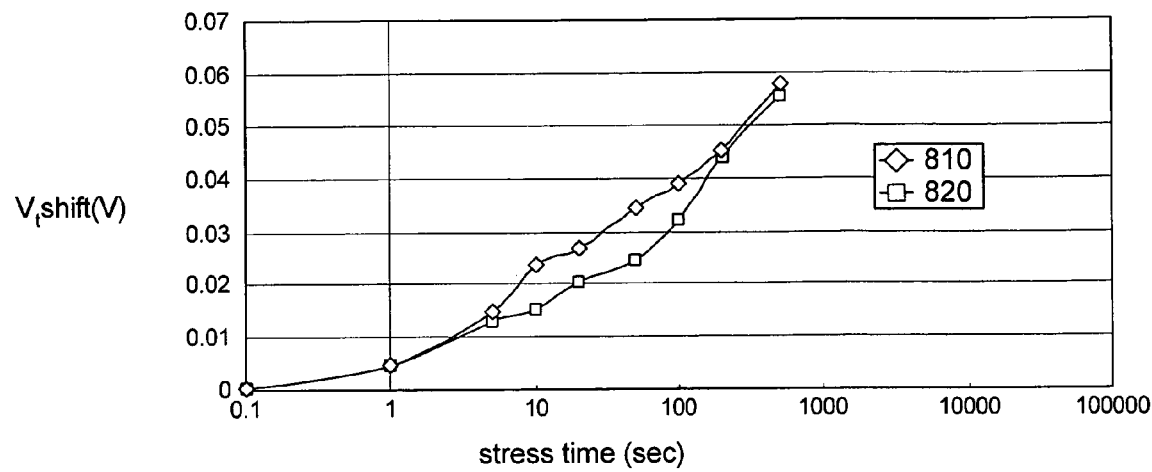
FIGS. 8A and 8B show experimental data for memory cells which indicate a greatly reduced read disturb, when a drain voltage for reading the cell is by a part of the charge-trapping structure in a low threshold state.
Figure 8B:
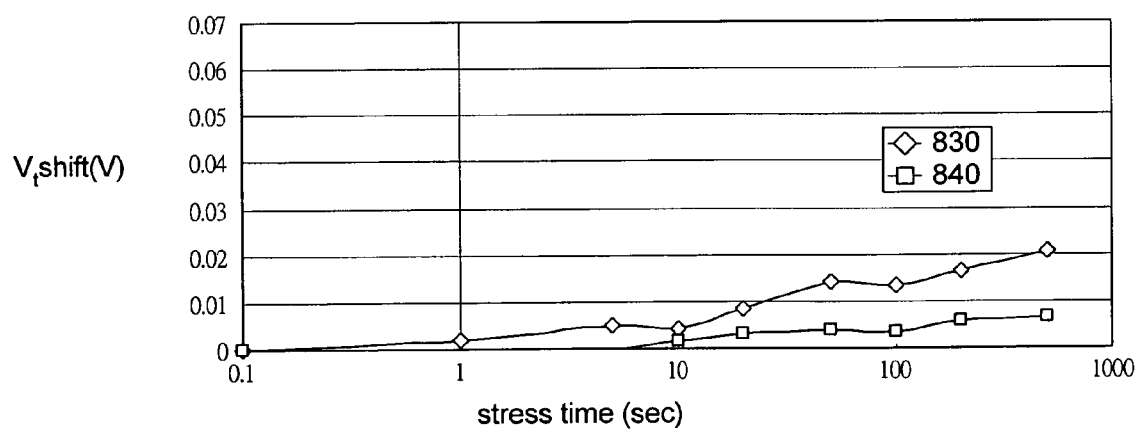

FIGS. 8A and 8B show stress testing experimental data for memory cells which indicate a greatly reduced read disturb, when a drain voltage for reading the cell is by a part of the charge-trapping structure in a low threshold state. A current-carrying terminal voltage of 1.6V is used to measure the threshold voltages, using the reverse read method. FIG. 8A has trace 810 showing the threshold voltage shift associated with the right side of the charge-trapping structure, and trace 820 showing the threshold voltage shift associated with the left side of the charge-trapping structure. The threshold voltage associated with the right side of the charge-trapping structure has been raised about 5.16V and is in the high threshold state, and the left side of the charge-trapping structure of the memory cell in FIG. 8A is in the low threshold state. During the stress testing conditions in FIG. 8A, the gate voltage is 4.6V, drain (left side current-carrying terminal) voltage is 1.6V, and the source (right side current-carrying terminal) voltage is 0V. Due to the read disturb effect, electrons moving into the left and right sides of the charge-trapping structure cause the rise in traces 810 and 820 showing the threshold voltage shift associated with the right and left sides of the charge-trapping structure.

FIG. 8B has trace 830 showing the threshold voltage shift associated with the right side of the charge-trapping structure, and trace 840 showing the threshold voltage shift associated with the left side of the charge-trapping structure. The right side of the charge-trapping structure is in the high threshold state (associated threshold voltage raised about 5.04V). The left side of the charge-trapping structure of the memory cell in FIG. 8B is in the low threshold state, but the threshold voltage associated with the left side of the charge-trapping structure of the memory cell is higher than for FIG. 8A, having been raised about 230 mV. During the stress testing conditions in FIG. 8B, the gate voltage is 4.6V, drain (left side current-carrying terminal) voltage is 1.6V, and the source (right side current-carrying terminal) voltage is 0V. Due to the raised threshold voltages that reduce the read disturb effect, traces 830 and 840 showing the threshold voltage shift associated with the right and left sides of the charge-trapping structure are relatively flat.

Figure 9:
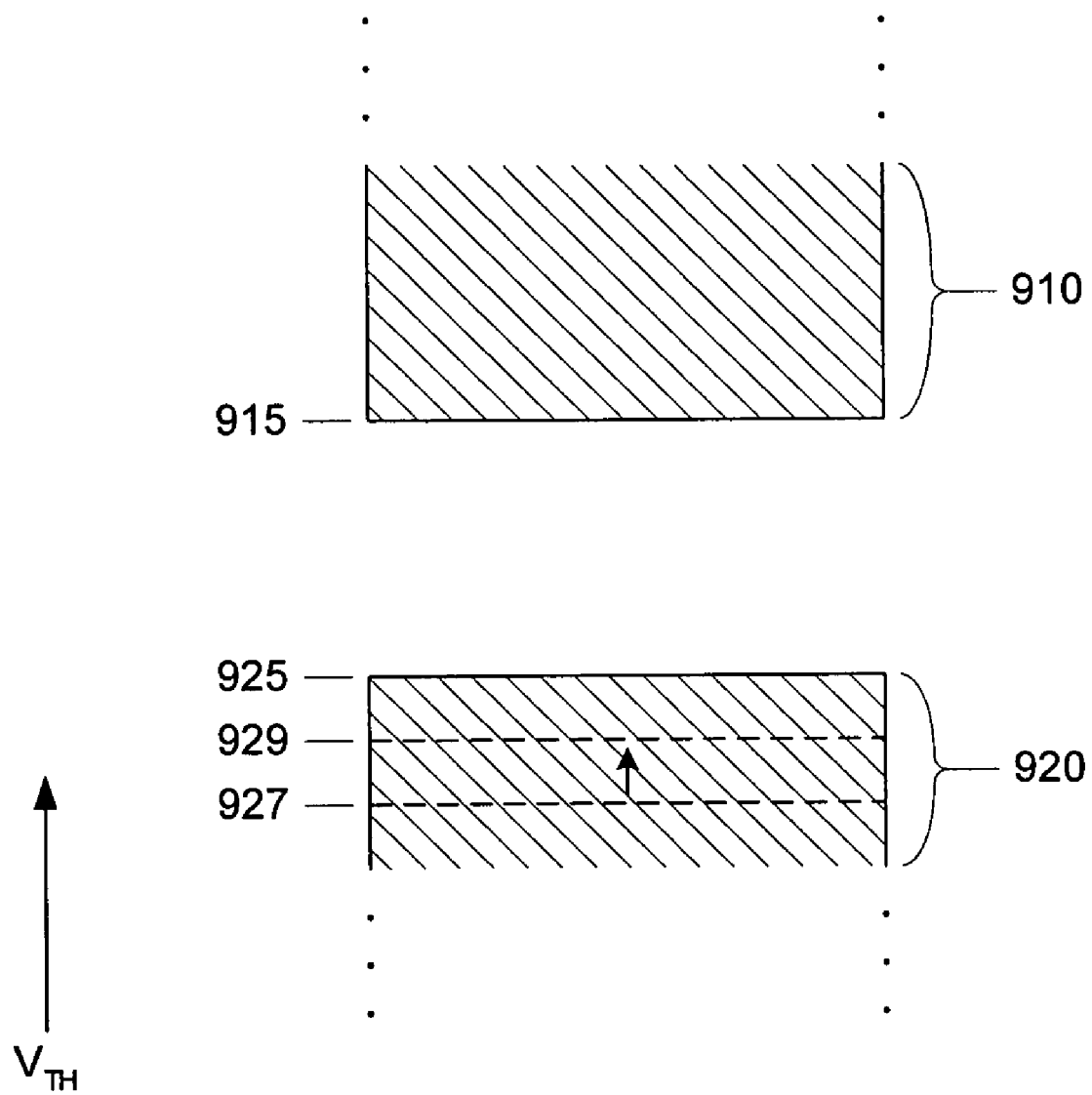
FIG. 9 is a schematic of threshold voltage, indicating two threshold states.

FIG. 9 is a schematic of threshold voltage, indicating two threshold states. High threshold state 910 is defined by a range of threshold voltages having a minimum threshold voltage of 915. Low threshold state 920 is defined by a range of threshold voltages having a maximum threshold voltage of 925.

In one embodiment, a high threshold state 910 is established in a part of the charge-trapping structure by setting the threshold voltage associated with the part to be above the minimum threshold voltage of 915. The threshold voltage associated with another part of the charge-trapping structure is raised, for example from the threshold voltage of 927 to the threshold voltage of 929. Even after the threshold voltage of another part of the charge-trapping structure is raised, the threshold voltage 929 is below the maximum threshold voltage of 925 of the low threshold state 920, and the other part of the charge-trapping structure remains within the low threshold state 920.

In another embodiment, a low threshold state 920 is stored in a charge-trapping memory cell by establishing the low threshold state 920 in different parts of the charge-trapping structure. The high threshold state 910 is stored in the charge-trapping memory cell by raising the threshold voltage of one part of the charge-trapping structure into the high threshold state 910 and raising the threshold voltage of another part of the charge-trapping structure into the high threshold state 910.

Figure 10:
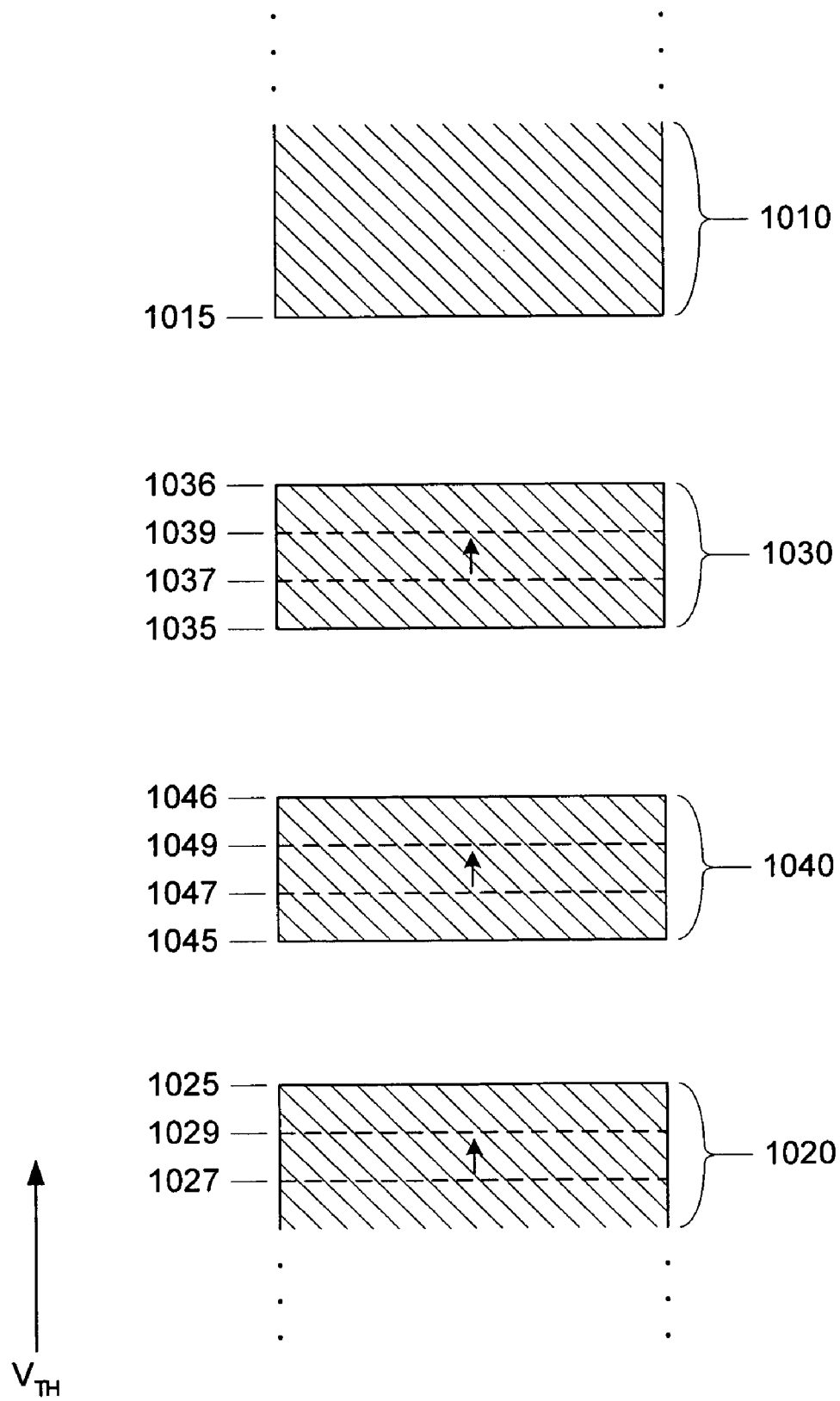
FIG. 10 is a schematic of threshold voltage, indicating four threshold states.

FIG. 10 is a schematic of threshold voltage, similar to FIG. 9, but showing four threshold states. Low threshold state 1020 is defined by a range of threshold voltages having a maximum threshold voltage of 1025. High threshold state 1040 is defined by a range of threshold voltages having a maximum threshold voltage of 1046 and a minimum threshold voltage of 1045. Higher threshold state 1030 is defined by a range of threshold voltages having a maximum threshold voltage of 1036 and a minimum threshold voltage of 1035. Another higher threshold state 1010 is defined by a range of threshold voltages having a minimum threshold voltage of 1015. Other embodiments have even more threshold states.

The multilevel threshold states shown in FIG. 10 apply to memory cells that apply symmetrical charges to different parts of the charge-trapping structure and to memory cells that apply asymmetrical charges to different parts of the charge-trapping structure.

Some embodiments apply asymmetrical charges to different parts of the charge-trapping structure. This has the advantage of being faster than applying asymmetrical charges. If part of the charge-trapping structure is in higher threshold state 1030, and another part of the charge-trapping structure is in higher threshold state 1010, then to reduce the read disturb effect, the threshold voltage of the part of the charge-trapping structure in higher threshold state 1030 can be raised, such as from the threshold voltage of 1037 to the threshold voltage of 1039. Similarly, if part of the charge-trapping structure is in higher threshold state 1040, and another part of the charge-trapping structure is in higher threshold state 1010 or 1030, then to reduce the read disturb effect, the threshold voltage of the part of the charge-trapping structure in higher threshold state 1040 can be raised, such as from the threshold voltage of 1047 to the threshold voltage of 1049. Finally, if part of the charge-trapping structure is in lower threshold state 1020, and another part of the charge-trapping structure is in threshold state 1010, 1030, or 1040, then to reduce the read disturb effect, the threshold voltage of the part of the charge-trapping structure in lower threshold state 1020 can be raised, such as from the threshold voltage of 1027 to the threshold voltage of 1029.

Figure 11:
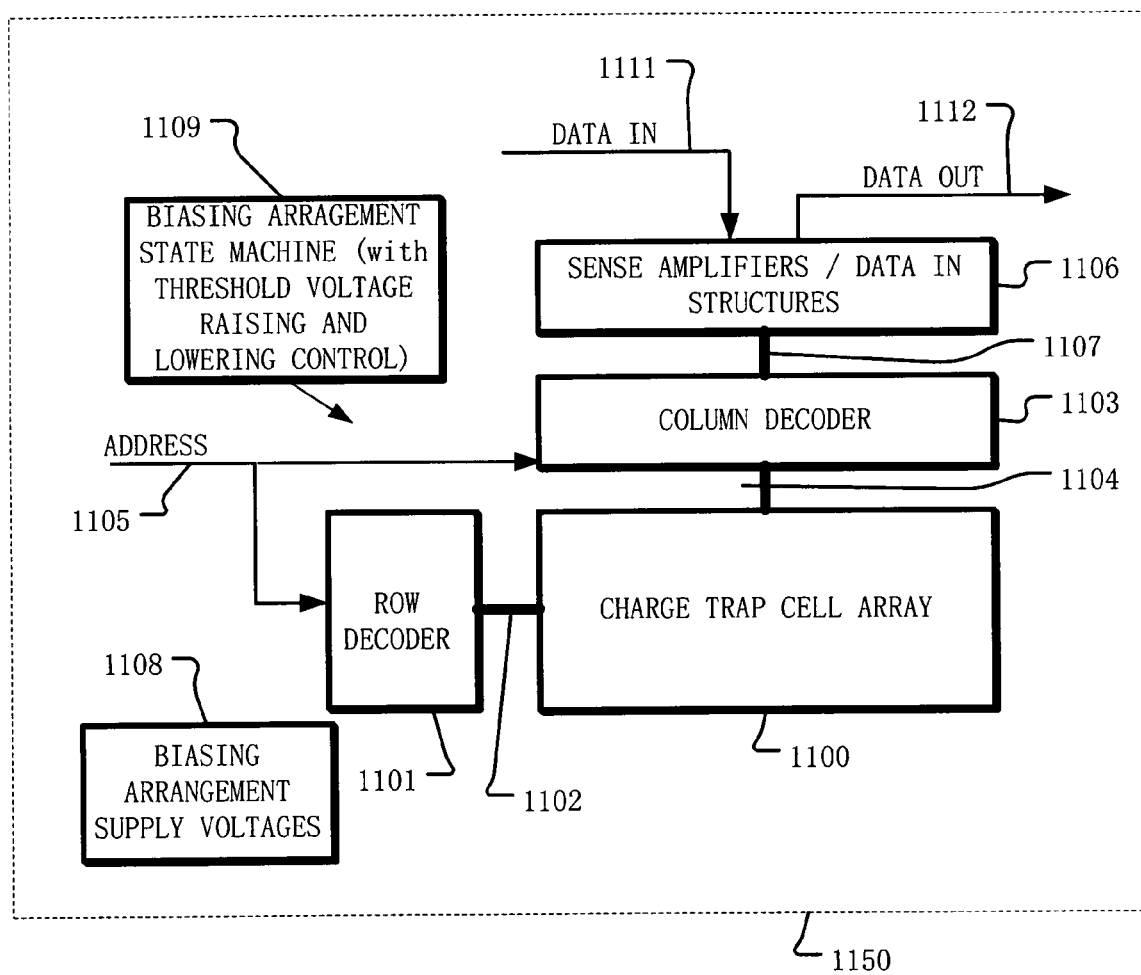
FIG. 11 is a schematic of an integrated circuit embodiment.

FIG. 11 is a simplified block diagram of an integrated circuit according to an embodiment of the present invention. The integrated circuit 1150 includes a memory array 1100 implemented using localized charge-trapping memory cells on a semiconductor substrate. A row decoder 1101 is coupled to a plurality of wordlines 1102 arranged along rows in the memory array 1100. A column decoder 1103 is coupled to a plurality of bitlines 1104 arranged along columns in the memory array 1100. Addresses are supplied on bus 1105 to column decoder 1103 and row decoder 1101. Sense amplifiers and data-in structures in block 1106 are coupled to the column decoder 1103 via data bus 1107. Data is supplied via the data-in line 1111 from input/output ports on the integrated circuit 1150, or from other data sources internal or external to the integrated circuit 1150, to the data-in structures in block 1106. Data is supplied via the data-out line 1112 from the sense amplifiers in block 1106 to input/output ports on the integrated circuit 150, or to other data destinations internal or external to the integrated circuit 1150. A biasing arrangement state machine 1109 controls the application of biasing arrangement supply voltages 1108, such as for the erase verify and program verify voltages, and raising and lowering threshold voltages of parts of the charge-trapping structure of a memory cell.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating a charge-trapping memory cell on a substrate, the charge-trapping memory cell having a first current-carrying terminal, a second current-carrying terminal, and a charge-trapping structure with a first trapping part and a second trapping part, each of the first trapping part and the second trapping part associated with a threshold voltage and at least a high threshold state and a low threshold state, comprising:
   responsive to a command to store the high threshold state in the first trapping part:
      applying a first biasing arrangement for establishing the high threshold state in the first trapping part by setting the threshold voltage associated with the first trapping part in the high threshold state, and
      applying a second biasing arrangement for raising the threshold voltage associated with the second trapping part without exceeding the maximum threshold voltage of the low threshold state.

2. The method of claim 1 wherein said raising reduces a read disturb effect on the charge-trapping memory cell.

3. The method of claim 1 wherein said raising reduces a read disturb effect on the charge-trapping memory cell when a read operation is performed that places a nonzero drain bias by the first trapping part.

4. The method of claim 1 wherein said raising reduces a read disturb effect on the charge-trapping memory cell when a read operation is performed that places a nonzero drain bias by the second trapping part.

5. The method of claim 1 wherein said raising includes adding electrons to the second trapping part.

6. The method of claim 1 wherein said raising reduces a lateral electric field in at least parts of the substrate under the first trapping part and the second trapping part.

7. The method of claim 1 wherein the first trapping part is by the first current-carrying terminal and the second trapping part is by the second current-carrying terminal.

8. The method of claim 1 wherein said raising raises the threshold voltage associated with the second trapping part by about 0.2 V to 1.0 V.

9. The method of claim 1 wherein each of the first trapping part and the second trapping part is associated with only two threshold states including the high threshold state and the low threshold state.

10. The method of claim 1 wherein said each of the first trapping part and the second trapping part is associated with at least four threshold states including the high threshold state, the low threshold state, and at least two other threshold states.

11. A charge-trapping integrated circuit, comprising:
   an array of charge-trapping memory cells each having at least a low threshold state and a high threshold state, each charge-trapping memory cell including:
      a first current-carrying terminal;
      a second current-carrying terminal; and
      a charge-trapping structure with a first trapping part and a second trapping part, each of the first trapping part and the second trapping part associated with a threshold voltage and at least a high threshold state and a low threshold state; and
   logic coupled to the array, the logic responsive to a command to store the high threshold state in the first trapping part by:
      applying a first biasing arrangement for establishing the high threshold state in the first trapping part by setting the threshold voltage associated with the first trapping part in the high threshold state, and
      applying a second biasing arrangement for raising the threshold voltage associated with the second trapping part without exceeding the maximum threshold voltage of the low threshold state.

12. The circuit of claim 11 wherein said raising reduces a read disturb effect on the charge-trapping memory cell.

13. The circuit of claim 11 wherein said raising reduces a read disturb effect on the charge-trapping memory cell when a read operation is performed that places a nonzero drain bias by the first trapping part.

14. The circuit of claim 11 wherein said raising reduces a read disturb effect on the charge-trapping memory cell when a read operation is performed that places a nonzero drain bias by the second trapping part.

15. The circuit of claim 11 wherein said raising includes adding electrons to the second trapping part.

16. The circuit of claim 11 wherein said raising reduces a lateral electric field in at least parts of the substrate under the first trapping part and the second trapping part.

17. The circuit of claim 11 wherein the first trapping part is by the first current-carrying terminal and the second trapping part is by the second current-carrying terminal.

18. The circuit of claim 11 wherein said raising raises the threshold voltage associated with the second trapping part by about 0.2 V to 1.0 V.

19. The circuit of claim 11 wherein each of the first trapping part and the second trapping part is associated with only two threshold states including the high threshold state and the low threshold state.

20. The circuit of claim 11 wherein each of the first trapping part and the second trapping part is associated with at least four threshold states including the high threshold state, the low threshold state, and at least two other threshold states.

21. A method of operating a charge-trapping memory cell on a substrate, the charge-trapping memory cell having a first current-carrying terminal, a second current-carrying terminal, and a charge-trapping structure with a first trapping part and a second trapping part, each of the first trapping part and the second trapping part associated with a threshold voltage and at least a high threshold state and a low threshold state, comprising:
responsive to a command to store the low threshold state in the first trapping part and the second trapping part:
applying a first biasing arrangement for establishing the low threshold state in the first trapping part and the second trapping part by setting the threshold voltages associated with the first trapping part and the second trapping part in the low threshold state, and then
applying a second biasing arrangement for raising the threshold voltage associated with the first trapping part without exceeding a maximum threshold voltage of the low threshold state and raising the threshold voltage associated with the second trapping part without exceeding the maximum threshold voltage of the low threshold state.

22. The method of claim 21 wherein said raisings of the threshold voltages include raising the threshold voltages associated with the first trapping part and the second trapping part to a substantially same voltage.

23. The method of claim 21 wherein said raisings of the threshold voltages include raising the threshold voltages associated with the first trapping part and the second trapping part to different voltages.

24. The method of claim 21 wherein said raisings of the threshold voltages reduce a read disturb effect on the charge-trapping memory cell.

25. The method of claim 21 wherein said raisings of the threshold voltages reduce a read disturb effect on the charge-trapping memory cell when a read operation is performed that places a nonzero drain bias by the first trapping part.

26. The method of claim 21 wherein said raisings of the threshold voltages reduce a read disturb effect on the charge-trapping memory cell when a read operation is performed that places a nonzero drain bias by the second trapping part.

27. The method of claim 21 wherein said raisings of the threshold voltages include adding electrons to the first trapping part and the second trapping part.

28. The method of claim 21 wherein said raisings of the threshold voltages include adding electrons to the first trapping part and the second trapping part in different operations.

29. The method of claim 21 wherein said raisings of the threshold voltages reduce a lateral electric field in at least parts of the substrate under the first trapping part and the second trapping part.

30. The method of claim 21 wherein the first trapping part is by the first current-carrying terminal and the second trapping part is by the second current-carrying terminal.

31. The method of claim 21 wherein said raisings of the threshold voltages raise the threshold voltage associated with the first trapping part and the second trapping part by about 0.2V to 1.0V.

32. The method of claim 21 wherein each of the first trapping part and the second trapping part is associated with only two threshold states including the high threshold state and the low threshold state.

33. The method of claim 21 wherein each of the first trapping part and the second trapping part is associated with at least four threshold states including the high threshold state, the low threshold state, and at least two other threshold states.

34. A charge-trapping integrated circuit, comprising:
an array of charge-trapping memory cells each having at least a low threshold state and a high threshold state, each charge-trapping memory cell including:
a first current-carrying terminal;
a second current-carrying terminal; and
a charge-trapping structure with a first trapping part and a second trapping part, each of the first trapping part and the second trapping part associated with a threshold voltage and at least a high threshold state and a low threshold state; and
logic coupled to the array, said logic responsive to a command to store the low threshold state in the first trapping part and the second trapping part by:
applying a first biasing arrangement for establishing the low threshold state in the first trapping part and the second trapping part by setting the threshold voltages associated with the first trapping part and the second trapping part in the low threshold state, and then
applying a second biasing arrangement for raising the threshold voltage associated with the first trapping part without exceeding a maximum threshold voltage of the low threshold state and raising the threshold voltage associated with the second trapping part without exceeding a maximum threshold voltage of the low threshold state.

35. The circuit of claim 34 wherein said raisings of the threshold voltages include raising the threshold voltages associated with the first trapping part and the second trapping part to a substantially same voltage.

36. The circuit of claim 34 wherein said raisings of the threshold voltages include raising the threshold voltages associated with the first trapping part and the second trapping part to different voltages.

37. The circuit of claim 34 wherein said raisings of the threshold voltages reduce a read disturb effect on the charge-trapping memory cell.

38. The circuit of claim 34 wherein said raisings of the threshold voltages reduce a read disturb effect on the charge-trapping memory cell when a read operation is performed that places a nonzero drain bias by the first trapping part.

39. The circuit of claim 34 wherein said raisings of the threshold voltages reduce a read disturb effect on the charge-trapping memory cell when a read operation is performed that places a nonzero drain bias by the second trapping part.

40. The circuit of claim 34 wherein said raisings of the threshold voltages include adding electrons to the first trapping part and the second trapping part.

41. The circuit of claim 34 wherein said raisings of the threshold voltages include adding electrons to the first trapping part and the second trapping part in different operations.

42. The circuit of claim 34 wherein said establishing the low threshold state establishes the low threshold state in a sector of multiple charge-trapping memory cells, and establishing the high threshold state establishing the high threshold state for all charge-trapping memory cells in the sector.

43. The circuit of claim 34 wherein said raisings of the threshold voltages reduce a lateral electric field in at least parts of the substrate under the first trapping part and the second trapping part.

44. The circuit of claim 34 wherein the first trapping part is by the first current-carrying terminal and the second trapping part is by the second current-carrying terminal.

45. The circuit of claim 34 wherein said raisings of the threshold voltages raise the threshold voltage associated with the first trapping part and the second trapping part by about 0.2V to 1.0 V.

46. The circuit of claim 34 wherein each of the first trapping part and the second trapping part is associated with only two threshold states including the high threshold state and the low threshold state.

47. The circuit of claim 34 wherein each of the first trapping part and the second trapping part is associated with at least four threshold states including the high threshold state, the low threshold state, and at least two other threshold states.

48. A method of operating a charge-trapping memory cell on a substrate, the charge-trapping memory cell having a first current-carrying terminal, a second current-carrying terminal, at least a low threshold state and a high threshold state, and a charge-trapping structure with a first trapping part and a second trapping part, each of the first trapping part and the second trapping part associated with a threshold voltage and at least a high threshold state and a low threshold state, comprising:

responsive to a command to store the low threshold state in the charge-trapping memory cell, applying a first biasing arrangement for establishing the low threshold state in the charge-trapping memory cell by setting the threshold voltages for the first trapping part and the second trapping part in the low threshold state; and responsive to a command to store the high threshold state in the charge-trapping memory cell, applying a second biasing arrangement for establishing the high threshold state in the charge-trapping memory cell by raising the threshold voltage for the first trapping part into the high threshold state and raising the threshold voltage for the second trapping part into the high threshold state.

49. The method of claim 48 wherein said establishing the high threshold state includes raising the threshold voltages associated with the first trapping part and the second trapping part to a substantially same voltage.

50. The method of claim 48 wherein said establishing the high threshold state includes raising the threshold voltages associated with the first trapping part and the second trapping part to different voltages.

51. The method of claim 48 wherein said establishing the high threshold state reduces a read disturb effect on the charge-trapping memory cell.

52. The method of claim 48 wherein said establishing the high threshold state includes adding electrons to the first trapping part and the second trapping part.

53. The method of claim 48 wherein said establishing the low threshold state establishes the low threshold state in a sector of multiple charge-trapping memory cells, and establishing the high threshold state establishing the high threshold state for all charge-trapping memory cells in the sector.

54. The method of claim 48 wherein said establishing the high threshold state reduces a lateral electric field in at least parts of the substrate under the first trapping part and the second trapping part.

55. The method of claim 48 wherein the first trapping part is by the first current-carrying terminal and the second trapping part is by the second current-carrying terminal.

56. The method of claim 48 wherein said establishing the high threshold state raises the threshold voltage associated with the first trapping part and the second trapping part by about 0.2 V to 1.0 V.

57. The method of claim 48 wherein the charge-trapping memory cell has at least one higher threshold state, each of the first trapping part and the second trapping part is associated with at least one higher threshold state, and each said higher threshold state of the first trapping part and the second trapping part is associated with threshold voltages higher than threshold voltages associated with the high threshold state and the low threshold state of the first trapping part and the second trapping part.

58. The method of claim 57, further comprising: responsive to a command to store the higher threshold state in the charge-trapping memory cell, applying a third biasing arrangement for establishing the higher threshold state in the charge-trapping memory cell by raising the threshold voltage for the first trapping part into the higher threshold state and raising the threshold voltage for the second trapping part into the higher threshold state.

59. The method of claim 48 wherein each of the first trapping part and the second trapping part is associated with only two threshold states including the high threshold state and the low threshold state.

60. A charge-trapping integrated circuit, comprising:

an array of charge-trapping memory cells each having at least a low threshold state and a high threshold state, each charge-trapping memory cell including:

a first current-carrying terminal;

a second current-carrying terminal; and a charge-trapping structure with a first trapping part and a second trapping part, each of the first trapping part and the second trapping part associated with a threshold voltage and at least a high threshold state and a low threshold state; and logic coupled to the array, said logic responsive to a command to store the high threshold state in the charge-trapping memory cell by applying a first biasing arrangement for establishing the low threshold state in the charge-trapping memory cell, including setting the threshold voltages for the first trapping part and the second trapping part in the low threshold state, and said logic responsive to a command to store the high threshold state in the charge-trapping memory cell by applying a second biasing arrangement for establishing the high threshold state in the charge-trapping memory cell, including raising the threshold voltage for the first trapping part into the high threshold state and raising the threshold voltage for the second trapping part into the high threshold state.

61. The circuit of claim 60 wherein said establishing the high threshold state includes raising the threshold voltages associated with the first trapping part and the second trapping part to a substantially same voltage.

62. The circuit of claim 60 wherein said establishing the high threshold state includes raising the threshold voltages associated with the first trapping part and the second trapping part to different voltages.

63. The circuit of claim 60 wherein said establishing the high threshold state reduces a read disturb effect on the charge-trapping memory cell.

64. The circuit of claim 60 wherein said establishing the high threshold state includes adding electrons to the first trapping part and the second trapping part.

65. The circuit of claim 60 wherein said establishing the high threshold state reduces a lateral electric field in at least parts of the substrate under the first trapping part and the second trapping part.

66. The circuit of claim 60 wherein the first trapping part is by the first current-carrying terminal and the second trapping part is by the second current-carrying terminal.

67. The circuit of claim 60 wherein said establishing the high threshold state raises the threshold voltage associated with the first trapping part and the second trapping part by about 0.2V to 1.0 V.

68. The circuit of claim 60 wherein the charge-trapping memory cell has at least one higher threshold state, each of the first trapping part and the second trapping part is associated with at least one higher threshold state, and each said higher threshold state of the first trapping part and the second trapping part is associated with threshold voltages higher than threshold voltages associated with the high threshold state and the low threshold state of the first trapping part and the second trapping part.

69. The circuit of claim 68, further comprising: responsive to a command to store the higher threshold state in the charge-trapping memory cell, applying a third biasing arrangement for establishing the higher threshold state in the charge-trapping memory cell by raising the threshold voltage for the first trapping part into the higher threshold state and raising the threshold voltage for the second trapping part into the higher threshold state.

70. The circuit of claim 60 wherein each of the first trapping part and the second trapping part is associated with only two threshold states including the high threshold state and the low threshold state.

* * * * *